(12) United States Patent
Van Bommel

(10) Patent No.: US 12,297,968 B2
(45) Date of Patent: May 13, 2025

(54) LED FILAMENT FOR EMITTING DIRECTIONAL LIGHT

(71) Applicant: SIGNIFY HOLDING B.V., Eindhoven (NL)

(72) Inventor: Ties Van Bommel, Horst (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 0 days.

(21) Appl. No.: 18/566,700

(22) PCT Filed: May 30, 2022

(86) PCT No.: PCT/EP2022/064551
§ 371 (c)(1),
(2) Date: Dec. 4, 2023

(87) PCT Pub. No.: WO2022/253735
PCT Pub. Date: Dec. 8, 2022

(65) Prior Publication Data
US 2024/0263751 A1   Aug. 8, 2024

(30) Foreign Application Priority Data

Jun. 4, 2021   (EP) .................................... 21177694

(51) Int. Cl.
*F21K 9/238*   (2016.01)
*F21K 9/68*   (2016.01)
(Continued)

(52) U.S. Cl.
CPC ................ *F21K 9/68* (2016.08); *F21K 9/238* (2016.08); *F21V 9/30* (2018.02); *F21Y 2103/10* (2016.08);
(Continued)

(58) Field of Classification Search
CPC ...... F21K 9/232; F21K 9/238; F21Y 2107/30; F21Y 2107/70
See application file for complete search history.

(56) References Cited

U.S. PATENT DOCUMENTS

2019/0086036 A1   3/2019   Hofmann et al.
2020/0303356 A1*  9/2020   Li ....................... H01L 25/0753
(Continued)

FOREIGN PATENT DOCUMENTS

CN   210197064 U    3/2020
WO   2019197394 A1  10/2019
(Continued)

*Primary Examiner* — Tracie Y Green

(57) ABSTRACT

The present invention relates to a light-emitting diode (LED) filament (1) configured to provide LED filament light (A, B) and comprising an elongated carrier (2) comprising a first elongated edge portion (3) and a second elongated edge portion (3') arranged at a distance (W1) from the first elongated edge portion (3), a first surface (4), a second surface (4') arranged opposite to the first surface (4), the first and the second surfaces (4,4') being delimited by the first and the second edge portions (3,3'). The LED filament (1) further comprises a plurality of first light-emitting diodes (5), LEDs, distributed along the first surface (4) of the elongated carrier (2), the plurality of first LEDs (5) being configured to emit a first LED light. The LED filament (1) also comprises a first at least partially light-transmissive elongated layer (6) encapsulating or covering the plurality of first LEDs (5) and at least partially encapsulating or covering the first surface (4) of the elongated carrier (2) and a second elongated reflective layer (7) arranged to asymmetrically encapsulate or cover the first at least partially light-transmissive elongated layer (6).

15 Claims, 3 Drawing Sheets

(51) Int. Cl.
  *F21V 9/30* (2018.01)
  *F21Y 103/10* (2016.01)
  *F21Y 107/00* (2016.01)
  *F21Y 113/17* (2016.01)
  *F21Y 115/10* (2016.01)

(52) U.S. Cl.
  CPC ....... *F21Y 2107/00* (2016.08); *F21Y 2113/17* (2016.08); *F21Y 2115/10* (2016.08)

(56) References Cited

U.S. PATENT DOCUMENTS

| | | | |
|---|---|---|---|
| 2022/0221112 A1* | 7/2022 | Van Bommel | F21K 9/232 |
| 2022/0373140 A1* | 11/2022 | Van Bommel | F21K 9/68 |
| 2023/0099125 A1* | 3/2023 | Van Bommel | H01L 25/0753 |

FOREIGN PATENT DOCUMENTS

| | | | | |
|---|---|---|---|---|
| WO | WO-2020190960 A1 * | 9/2020 | ........... | C09K 11/617 |
| WO | 2020208009 A1 | 10/2020 | | |
| WO | 2020221653 A1 | 11/2020 | | |
| WO | 2020239655 A1 | 12/2020 | | |
| WO | 2021053080 A1 | 3/2021 | | |

\* cited by examiner

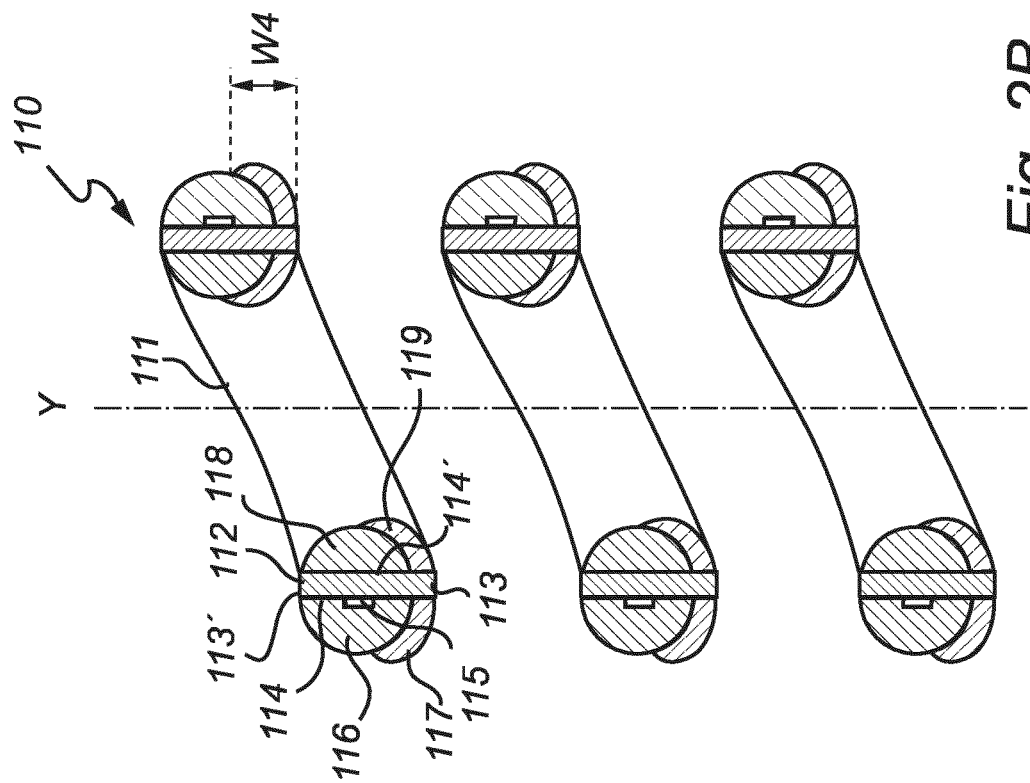
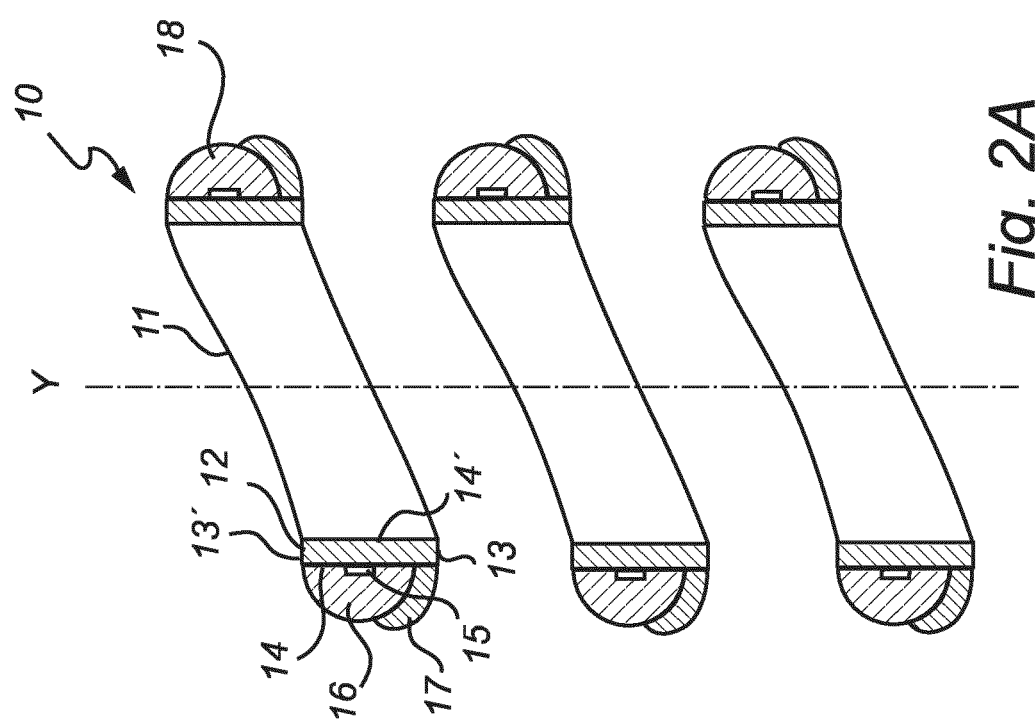

LED FILAMENT FOR EMITTING DIRECTIONAL LIGHT

CROSS-REFERENCE TO PRIOR APPLICATIONS

This application is the U.S. National Phase application under 35 U.S.C. § 371 of International Application No. PCT/EP2022/064551, filed on May 30, 2022, which claims the benefit of European Patent application Ser. No. 21/177,694.3, filed on Jun. 4, 2021. These applications are hereby incorporated by reference herein.

TECHNICAL FIELD

The present invention relates to a light emitting diode (LED) filament emitting LED filament light and to a lighting device comprising such a LED filament.

BACKGROUND

The use of light emitting diodes, LEDs, for illumination purposes continues to attract attention. Compared to incandescent lamps, fluorescent lamps, neon tube lamps, etc., LEDs provide numerous advantages such as longer operational life, reduced power consumption, and increased efficiency related to the ratio between light energy and heat energy. For this reason, incandescent lamps are rapidly being replaced by LED based lighting solutions. It is nevertheless appreciated and desired by users to have LED based light sources which resemble an incandescent bulb. For this purpose, it is possible to make use of the infrastructure for producing incandescent lamps based on glass and replace the filament with LEDs. One of the concepts is based on LED filaments placed in such a bulb. The appearances of these lamps are highly appreciated as they look very decorative.

It is however desired to obtain LED filaments having an improved aesthetical appearance and functionality.

The disclosure in WO 2020/208009 relates to a light-emitting diode, LED, filament. According to an embodiment, the LED filament comprises an elongated substrate and a plurality of light-emitting diodes, LEDs, which are mechanically coupled to the substrate. According to an embodiment, the LED filament further comprises an at least in part light-transmissive encapsulations and at least partially encapsulates the substrate, and a plurality of at least partially light-reflective particles which are arranged on an outer surface of the encapsulation.

SUMMARY

In view of the above discussion, the purpose of the present invention is to provide a LED filament which has an improved functionality.

The present invention thus provides a light-emitting diode (LED) filament configured to provide LED filament light and comprising an elongated carrier comprising a first elongated edge portion and a second elongated edge portion arranged at a distance W1 from the first elongated edge portion. The elongated carrier further comprises a first surface, a second surface arranged opposite to the first surface, wherein the first and the second surfaces are delimited by the first and the second edge portions. The first and the second surfaces may be substantially parallel to each other.

As evident from the above, the distance W1 corresponds to the width of the elongated carrier.

The term "LED" as used in the context of the present invention implies any type of LED known in the art, such as inorganic LED(s), organic LED(s), polymer/polymeric LEDs, violet LEDs, blue LEDs, optically pumped phosphor coated LEDs, optically pumped nano-crystal LEDs. As used herein, the term "LED" can encompass a bare LED die arranged in a housing, which may be referred to as a LED package.

The term "elongated carrier" means a substrate having a longitudinal extension and a width, such that the longitudinal extension is greater than the width. Preferably, the elongated carrier according to the present invention is in the form of a rectangular elongated strip.

The elongated carrier may be formed of rigid materials e.g. glass, ceramic, sapphire, or quartz, or formed of flexible materials, e.g. polymer such as polyamide. Preferably, the elongated carrier of the present invention is flexible. By the term "flexible" is meant that the elongated carrier may be arranged into different shapes by bending, folding, twisting, or any combination thereof. Further, the term "flexible" means that the shape of the elongated carrier may be malleable or adaptable. In particular, the elongated carrier may be formed into a spiral or helical shape.

The elongated carrier may be at least partially light-transmissive, preferably translucent, and more preferably transparent. The elongated carrier of the present invention may have a transmittance of at least 50%, preferably at least 65%, more preferably at least 75%.

The elongated carrier may be reflective. In particular, the elongated carrier may have reflectivity of at least 80%.

The LED filament according to the present invention further comprises a plurality of first LEDs, distributed along the first surface of the elongated carrier. The plurality of first LEDs is configured to emit first LED light. Preferably, the second surface of the elongated carrier comprises no LEDs.

The plurality of first LEDs may be evenly distributed along the entire length of the elongated carrier. By the expression "evenly distributed" is meant that the number of first LEDs per area unit of the first surface of the elongated carrier is constant along the entire length of the elongated carrier.

In particular, the plurality of first LEDs may be arranged as a single linear array, such as a single straight column. In such an embodiment, the LED filament may be slim, while providing a possibility to arrange LEDs emitting different colors and/or color temperatures. Further, the plurality of first LEDs may be arranged as a wave-shaped line, a zig-zag line, or the like. Such an embodiment provides a high light transmission through the elongated carrier.

Alternatively, the plurality of first LEDs may be arranged as several linear arrays, preferably being parallel to each other. Further, the plurality of first LEDs may be distributed in any other ordered pattern, such as stars, triangles, circles, or the like, or may be randomly distributed along the elongated carrier.

It is further conceivable to provide a plurality of first LEDs being arranged as a combination of at least two of the above-mentioned distribution patterns. In other words, a first subset of first LEDs of the plurality of first LEDs may be arranged in a first distribution pattern, thus forming a first LED filament section, and a second subset of first LEDs of the plurality of first LEDs may be arranged in a second distribution pattern, thus forming a second LED filament section. The LED filament may comprise a plurality of the first and second LED filament sections alternatingly arranged in a succession along the LED filament. When the LED filament is arranged in a substantially spiral shape, the first LED filament sections may be parallel to each other, and the second LED filament sections may be parallel to each other.

The plurality of first LEDs may be arranged at a distance S from the first elongated edge portion of the elongated carrier. It should be noted that the S-value is applicable for arrangements wherein the LEDs are arranged in a linear array. In particular, the plurality of first LEDs may be arranged asymmetrically, such that S≠W½. When the plurality of first LEDs is arranged closer to the first edge portion, such that S<W1-S, the beam shaping properties are improved. On the other hand, when the plurality of first LEDs is arranged closer to the second edge portion, such that S>W1-S, visibility of direct LED light is improved.

The plurality of first LEDs may comprise at least 10 LEDs, preferably at least 20 LEDs, more preferably at least 30 LEDs.

The elongated carrier of the LED filament is arranged to support the plurality of first LEDs. Moreover, the elongated carrier may comprise electrodes for electrically connecting the at least one LED of the plurality of first LEDs. The plurality of first LEDs may be mechanically coupled to the substrate. A controller may be provided for controlling the plurality of first LEDs. In particular, each LED of the plurality of first LEDs may be controlled individually. The plurality of first LEDs may comprise LEDs having different colors and/or different color temperatures.

At least 50%, preferably at least 60%, more preferably at least 70%, most preferably at least 80% of the elongated carrier is free from LEDs, electrodes and/or other components. In other words, less than 50%, preferably less than 40%, more preferably less than 30% and most preferably less than 20% of the elongated carrier comprises LEDs, electrodes and/or other components.

The LED filament according to the present invention further comprises a first at least partially light-transmissive elongated layer encapsulating or covering the plurality of first LEDs and at least partially encapsulating or covering the first surface of the elongated carrier. The first at least partially light-transmissive elongated layer may be translucent. Preferably, the first at least partially light-transmissive elongated layer is transparent, such that optimal and efficient light mixing and improved directional lighting is achieved. By the term "directional light" is in the context of the present invention understood a LED light being emitted predominantly in a spherical sector. The cone radius of the spherical sector may be less than 180°.

The first at least partially light-transmissive elongated layer preferably comprises or consists of polysiloxane.

By the term "encapsulate" is meant to surround, encapsulate and/or enclose at least partially. By the term "translucent" in the context of the present invention is meant a material allowing light to pass through, wherein the photons can be scattered at either of the two interfaces or internally.

The first at least partially light-transmissive elongated layer may be applied on the first surface of the elongated carrier by any suitable method known in the art. In particular, the first at least partially light-transmissive elongated layer may be dispensed, thus providing simple and cost-efficient manufacturing.

The first at least partially light-transmissive elongated layer may comprise a luminescent material, such as phosphor, in particular inorganic phosphor, configured to at least partially convert the first LED light into first converted light. The luminescent material may at least partly convert LED light into converted light.

The first at least partially light-transmissive elongated layer may comprise a plurality of sublayers having different properties. In particular, the first at least partially light-transmissive elongated layer may comprise a first sublayer encapsulating or covering the plurality of first LEDs and at least partially encapsulating or covering the first surface of the elongated carrier. The first sublayer may comprise a luminescent material, e.g. a phosphor. Further, the first at least partially light-transmissive elongated layer may comprise a second sublayer encapsulating or covering the first sublayer. The second sublayer may be a translucent layer, preferably a transparent layer. The second sublayer may be free from a luminescent material.

The LED filament according to the present invention further comprises a second elongated reflective layer arranged to asymmetrically encapsulate or cover a portion of the first at least partially light-transmissive elongated layer.

The term "asymmetrically" in the context of the present invention means that the LED filament has a cross-section perpendicular to the longitudinal extension of the elongated carrier, the cross-section comprising a first half and a second half on each side of the central axis being perpendicular to the first and/or the second surface of the elongated carrier, wherein the first and the second halves are not identical.

Further, the second elongated reflective layer may encapsulate or cover the first edge portion of the elongated carrier.

The second elongated reflective layer may have reflectivity of at least 60%. Preferably, the second elongated reflective layer may have reflectivity of at least 70%, more preferably at least 75%, most preferably at least 80%. The higher the reflectivity, the better the directional LED light.

Further, the second elongated reflective layer may have transmittance in the range from 5% to 40%. Preferably, the second elongated reflective layer may have transmittance in the range from 10% to 30%, more preferably in the range from 10% to 25%, most preferably in the range from 10% to 20%. In particular, providing the second elongated reflective layer having relatively high reflectivity along with some light transmittance results in the LED filament having an appealing appearance, e.g. a larger viewing angle.

The second elongated reflective layer may comprise light-scattering particles, such as $Al_2O_3$, $BaSO_4$, $TiO_2$ or combinations thereof. The light-scattering particles may be randomly distributed throughout the second elongated reflective layer or may be distributed in an ordered manner. The light-scattering particles may be dispersed in a polymer matrix. The light-scattering particles may have a high aspect ratio and may be relatively flat. The term "light-scattering particles" thus includes light-reflective flakes. The light-reflective flakes may have a particle length $L_p$, a particle width $W_p$, and a particle thickness $T_p$. Preferably, $L_p>10T_p$. Additionally, or alternatively, $W_p>T_p$. The flakes may be aluminum flakes. The polymer matrix preferably comprises or consists of polysiloxane. Such an embodiment offers the advantage of simple and cost-efficient manufacturing process.

Further, the at least partially light-scattering particles may be randomly oriented or may be oriented e.g. due to a leafing property of the flakes in a medium such as the polymer matrix, and optionally an additional solvent and/or liquid.

It is further conceivable that at least a portion of the at least partially light-scattering particles has a wavelength dependent reflection coefficient. Additionally, or alternatively, at least a portion of the at least partially light-scattering particles comprises a multilayer reflector or a dichroic mirror. The light-scattering particles may have a high constant reflection for the visible wavelength range.

The second elongated reflective layer may be light diffusive in order to improve the directional emission of LED light. In order to achieve the light diffusive property, the second elongated reflective layer should comprise light-scattering particles as described above, and also have a certain light transmittance.

The second elongated reflective layer may be applied on the first at least partially light-transmissive elongated layer by any suitable method known in the art. In particular, the second reflective layer may be dispensed, thus providing simple and cost-efficient manufacturing.

Preferably, the second elongated reflective layer is arranged such that it has a reflectivity gradient along the distance W1. Such a reflectivity gradient may be achieved by altering the concentration of light-scattering particles along the distance W1. Alternatively, or additionally, the reflectivity gradient may be achieved by altering the thickness of the second elongated reflective layer along the distance W1. By the term "thickness" is understood the extension of the second elongated reflective layer in the direction being perpendicular to the longitudinal extension and the width of the elongated carrier. Preferably, the reflectivity gradient is achieved by altering the thickness of the second elongated reflective layer along the distance W1.

The second elongated reflective layer may have a width W2 measured from the first edge portion of the elongated carrier. The ratio between the width of the second elongated reflective layer and the width of the elongated carrier, i.e. W2/W1, may be from 0.3 to 0.8, preferably from 0.4 to 0.7, more preferably from 0.5 to 0.6.

The area (AR) of the first at least partially light-transmissive elongated layer being encapsulated or covered by the second elongated reflective layer may be in the range from 30% to 80%, preferably from 40% to 70%, more preferably from 50% to 60%.

Further, the width of the second elongated reflective layer may be greater than the distance from the first edge portion to the plurality of first LEDs, i.e. W2>S.

The second elongated reflective layer may be flexible and may be made of silicone or polyurethane. Preferably, the elongated carrier, the first at least partially light-transmissive elongated layer and the second elongated reflective layer are flexible, such that the LED filament may be arranged in a spiral or helix, thus resembling an incandescent light bulb.

The second surface of the elongated carrier may comprise a third at least partially light-transmissive elongated layer at least partially encapsulating or covering the second surface of the elongated carrier. The third at least partially light-transmissive elongated layer may have features being same as or different from the features of the first at least partially light-transmissive elongated layer.

The LED filament according to the present invention may comprise a fourth elongated reflective layer asymmetrically encapsulating or covering a portion of the third elongated reflective layer. Alternatively, it is conceivable that the second elongated layer encapsulates or covers a portion of the first at least partially light-transmissive elongated layer, the first edge portion of the elongated carrier, and a portion of the third at least partially light-transmissive elongated layer. Indeed, the portion of the LED filament being free from the second and/or the fourth reflective layer should be sufficient enough in order to provide an adequate amount of directional LED light to be emitted.

The features of the fourth elongated reflective layer may be same as or different from the features of the second elongated reflective layer. In particular, the fourth elongated reflective layer may have a width W4 measured from the first edge portion of the elongated carrier being same as the width W2 of the second elongated reflective layer. In such an embodiment, an advantage of a homogenous and/or symmetric light is achieved. Alternatively, the fourth elongated reflective layer may have a width W4 being different from the width W2 of the second elongated reflective layer in order to enable tuning of the light effect. Further, the fourth elongated reflective layer may have a shape being same as or different from the shape of the second elongated reflective layer.

The fourth elongated reflective layer may be arranged in a different direction than the second elongated reflective layer. In other words, if the second elongated reflective layer is arranged adjacent to the first edge portion of the elongated carrier, the fourth elongated reflective layer may be arranged adjacent to the second edge portion of the elongated carrier.

The LED filament of the present invention may further comprise a plurality of second LEDs distributed along the second surface of the elongated carrier. The plurality of second LEDs is configured to emit a second LED light. The third at least partially light-transmissive elongated layer may in such an embodiment be arranged for encapsulating or covering the plurality of second LEDs.

According to the present invention, when the first at least partially light-transmissive elongated layer is translucent, preferably transparent, the second elongated reflective layer may be free from a light converting material.

It should be noted that when the LED filament is arranged in a spiral or helical shape, a spiral or a helix comprising the LED filament is formed. The spiral has a longitudinal extension along a central axis, an outer surface facing away from the central axis, and an inner surface facing the central axis. Preferably, the first surface of the LED filament constitutes the outer surface of the spiral.

The spiral comprising the LED filament may be arranged such that the central axis is oriented vertically. In such an embodiment, the elongated carrier may be arranged such that the first edge portion of the elongated carrier is oriented in a downward direction, and the second edge portion of the elongated carrier is oriented in an upward direction. Alternatively, the elongated carrier may be arranged such that the first edge portion of the elongated carrier is oriented in an upward direction, and the second edge portion of the elongated carrier is oriented in a downward direction. In the context of the present invention, the term "downward" is to be understood as a direction aligned with a vector of gravitational acceleration. The vector of gravitational acceleration may be understood as being a gravitational acceleration vector of a celestial body, e.g. the Earth, on which the spiral comprising the LED filament is arranged or located. It is intuitively understood that the term "upward direction" is the direction being opposite to the downward direction, i.e. a direction arranged 1800 from the downward direction.

Preferably, the spiral comprising the LED filament according to the present invention is arranged such that the first edge portion of the elongated carrier is oriented in a downward direction, and the second edge portion of the elongated carrier is oriented in an upward direction. Thus, the second elongated reflective layer will also be oriented in the downward direction. Consequently, the directional LED light will be emitted substantially in the upward direction.

The LED filament according to the present invention may have a white off-state appearance. For the purpose of describing the invention, the term "white appearance" is used to denote the optical appearance of an entity that either emits white light or exhibits a substantially constant reflectivity spectrum in the visible region, i.e., its reflectivity is not dependent on wavelength. In other words, an entity is considered to have a white appearance if white incident light is reflected as white light. In particular, the LED filament may have a white off-state appearance when the user observes the spiral comprising the LED filament substantially in the upward direction, i.e. when the spiral comprising the LED filament is arranged substantially above the user.

The LED filament light emitted by the LED filament of the present invention will comprise the first LED light being transmitted through the first at least partially light-transmissive elongated layer, hereinafter being referred to as direct LED light. Further, the LED filament light will comprise the first LED light being reflected by the second elongated reflective layer, hereinafter being referred to as reflected LED light. The LED light emitted by the plurality of first LEDs arranged at the first surface of the elongated carrier will pass through the first at least partially light-transmissive elongated layer, wherein it will at least partially be reflected by the elongated reflective layer, pass through the first at least partially light-transmissive elongated layer once more, and will eventually be emitted by the LED filament as reflected LED light. The direct LED light and the reflected LED light constitute directional LED light. In particular, at least 70%, preferably at least 80%, more preferably at least 85%, most preferably at least 90% of the LED filament light may be directional LED light. Such an embodiment offers the advantage of improved optical properties of the LED filament.

In case the first at least partially light-transmissive elongated layer comprises a light-converting material, the direct LED light will at least partially be converted to converted LED light. In such an embodiment, the converted LED light will constitute a portion of the LED filament light.

The LED light that has not been reflected by the second elongated reflective layer will be emitted through the second elongated reflective layer and will hereinafter be referred to as transmitted LED light. The LED filament light according to the present invention may therefore comprise direct LED light, reflected LED light, converted LED light, and transmitted LED light. Further, a portion of the first LED light may be transmitted through the elongated carrier, thus providing indirect LED light, which will in such a case be a part of the LED filament light.

When a plurality of second LEDs is present for providing a second LED light, the LED filament light may further comprise portions being analogous to the ones described in relation to the first LED light, i.e. direct LED light, reflected LED light, converted LED light, transmitted LED light, and/or indirect LED light.

The present invention further related to a lamp or a luminaire comprising a LED filament disclosed above and a light exit window. As mentioned above, it is desirable to provide a lamp or a luminaire resembling an incandescent light bulb. To this end, the LED filament may be arranged in a spiral or helical shape.

The luminaire may comprise a housing comprising a light exit window arranged such that the outer surface of the spiral comprising the LED filament faces the light exit window. By such an arrangement, the LED filament light comprising or consisting of directional LED light will be emitted through the light exit window. The user observing the light exit window will perceive an improved performance of the luminaire, providing LED filament light of high quality spatial light distribution. The luminaire may further comprise a mounting means for mounting the luminaire to a wall or a ceiling.

When the LED filament comprises a plurality of second LEDs as described above, the lamp or the luminaire may further comprise a controller for individually controlling the plurality of first LEDs and the plurality of second LEDs for providing different directional LED lights. As mentioned above, the fourth elongated reflective layer may be arranged adjacent to the edge portion being different from the edge portion being adjacent to the second elongated reflective layer. In other words, the light path created by the fourth elongated reflective layer may be arranged in a different direction compared to the light path created by the second elongated reflective layer. By individually controlling the plurality of first LEDs and the plurality of second LEDs, the user may decide whether the LED filament light will be emitted in the downward direction, in the upward direction or in both directions. Such an embodiment is particularly advantageous when the elongated carrier is reflective, preferably highly reflective having reflectivity of at least 80%. When the LED filament is arranged in spiral or helical configuration, such an embodiment offers the advantage of highly decorative and adaptable LED filament light.

The lamp may further comprise a cap, an envelope, a driver and/or a controller. The cap and/or the envelope may at least partially enclose the LED filament.

BRIEF DESCRIPTION OF THE DRAWINGS

Embodiments of the invention will now be described by way of example with reference to the accompanying drawings, of which:

FIGS. 2a-2b illustrate cross-sections of a spiral comprising the LED filament according to exemplifying embodiment of the present invention;

Figure 1A:
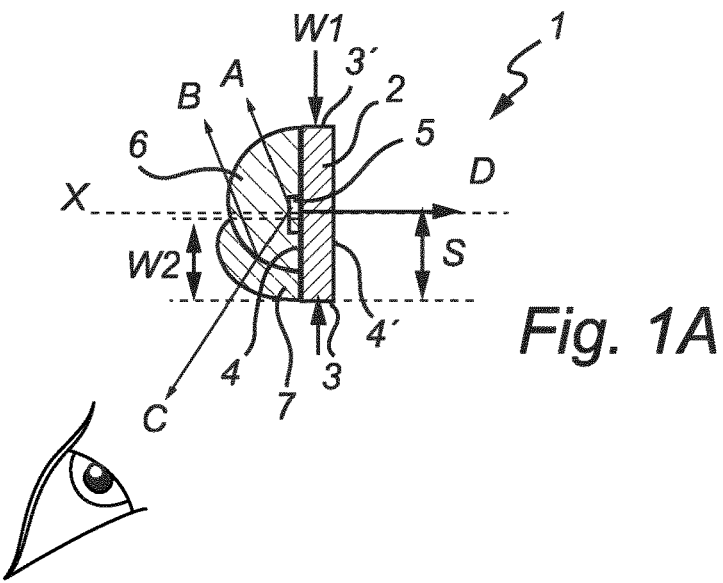
FIGS. 1a-1c shows cross-sections of a LED filament according to exemplifying embodiments of the present invention.

All the figures are schematic, not necessarily to scale, and generally only show parts which are necessary in order to elucidate embodiments of the present invention, wherein other parts may be omitted or merely suggested.

DETAILED DESCRIPTION

The present invention will now be described hereinafter with reference to the accompanying drawings, in which exemplifying embodiments of the present invention are shown. The present invention may, however, be embodied in many different forms and should not be construed as limited to the embodiments of the present invention set forth herein; rather, these embodiments of the present invention are provided by way of example so that this disclosure will convey the scope of the invention to those skilled in the art. In the drawings, identical or similar reference numerals denote the same or similar components having a same or similar function, unless specifically stated otherwise.

FIG. 1 illustrates a LED filament 1 configured to provide LED filament light and comprising an elongated carrier 2 comprising a first elongated edge portion 3 and a second elongated edge portion 3' arranged at a distance W1 from the first elongated edge portion 3. The elongated carrier 2 further comprises a first surface 4, a second surface 4' arranged opposite to the first surface 4, wherein the first and the second surfaces 4, 4' are delimited by the first and the second edge portions 3, 3'. The first and the second surfaces 4, 4' are substantially parallel to each other. The distance W1 corresponds to the width of the elongated carrier 2.

The LED filament 1 depicted in FIG. 1a further comprises a plurality of first LEDs 5, distributed along the first surface 4 of the elongated carrier 2. The plurality of first LEDs 5 is configured to emit first LED light. The second surface 4' of the elongated carrier comprises no LEDs.

The plurality of first LEDs 5 is arranged at a distance S from the first elongated edge portion 4 of the elongated carrier 2. In particular, the plurality of first LEDs 5 is arranged symmetrically, such that S=W½.

The LED filament 1 according to the embodiment depicted in FIG. 1a further comprises a first at least partially light-transmissive elongated layer 6 encapsulating or covering the plurality of first LEDs 5 and partially encapsulating or covering the first surface 4 of the elongated carrier 2. The first at least partially light-transmissive elongated layer 6 is transparent, such that optimal and efficient light mixing and improved directional lighting is achieved, as will be discussed in greater detail below.

The LED filament 1 further comprises a second elongated reflective layer 7 arranged to asymmetrically encapsulate or cover a portion of the first at least partially light-transmissive elongated layer 6.

As is evident from FIG. 1a, the LED filament 1 has a cross-section perpendicular to the longitudinal extension of the elongated carrier 2 comprising a first half and a second half on each side of the central axis X being perpendicular to the first and the second surface 4, 4' of the elongated carrier 2, wherein the first and the second halves are not identical.

The second elongated reflective layer 7 has a width W2 measured from the first edge portion 3' of the elongated carrier 2.

As depicted in FIG. 1a, the LED filament light emitted by the LED filament 1 of the present invention will comprise the first LED light being transmitted through the first at least partially light-transmissive elongated layer, hereinafter being referred to as direct LED light A. Further, the LED filament light will comprise the first LED light being reflected by the second elongated reflective layer, hereinafter being referred to as reflected LED light B. The LED light emitted by the plurality of first LEDs 5 arranged at the first surface 4 of the elongated carrier 2 will pass through the first at least partially light-transmissive elongated layer 6, wherein it will at least partially be reflected by the elongated reflective layer 7, pass through the first at least partially light-transmissive elongated layer 6 once more, and will eventually be emitted by the LED filament as reflected LED light B. The direct LED light A and the reflected LED light B constitute directional LED light.

The LED light that has not been reflected by the elongated reflective layer 7 will be emitted through the elongated reflective layer 7 and will hereinafter be referred to as transmitted LED light C. The LED filament light according to the embodiment depicted in FIG. 1a will therefore comprise direct LED light A, reflected LED light B and transmitted LED light C. Further, a portion of the first LED light is transmitted through the elongated carrier 2, thus providing indirect LED light D, which constitutes a part of the LED filament light.

Figure 1B:
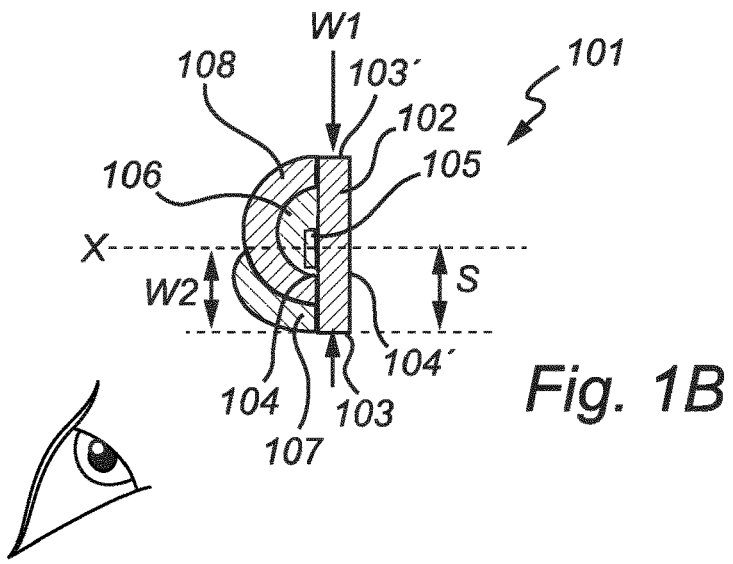

FIG. 1b illustrates another embodiment of the LED filament according to the present invention. FIG. 1b illustrates a LED filament 101 configured to provide LED filament light and comprising an elongated carrier 102 comprising a first elongated edge portion 103 and a second elongated edge portion 103' arranged at a distance W1 from the first elongated edge portion 103. The elongated carrier 102 further comprises a first surface 104, a second surface 104' arranged opposite to the first surface 104, wherein the first and the second surfaces 104, 104' are delimited by the first and the second edge portions 103, 103'. The first and the second surfaces 104, 104' are substantially parallel to each other. The distance W1 corresponds to the width of the elongated carrier 102.

The LED filament 1 depicted in FIG. 1a further comprises a plurality of first LEDs 105, distributed along the first surface 104 of the elongated carrier 102. The plurality of first LEDs 105 is configured to emit first LED light. The second surface 104' of the elongated carrier comprises no LEDs.

The plurality of first LEDs 105 is arranged at a distance S from the first elongated edge portion 3 of the elongated carrier 102. In particular, the plurality of first LEDs 105 is arranged symmetrically, such that S=W½.

The LED filament 101 according to the embodiment depicted in FIG. 1b further comprises a first at least partially light-transmissive elongated layer comprising a first sublayer 106 encapsulating or covering the plurality of first LEDs 105 and partially encapsulating or covering the first surface 104 of the elongated carrier 102, and a second sublayer 108 encapsulating or covering the first sublayer 106.

The LED filament 101 further comprises a second elongated reflective layer 107 arranged to asymmetrically encapsulate or cover a portion of the first at least partially light-transmissive elongated layer 106, 108.

As is evident from FIG. 1b, the LED filament 101 has a cross-section perpendicular to the longitudinal extension of the elongated carrier 102 comprising a first half and a second half on each side of the central axis X being perpendicular to the first and the second surface 104, 104' of the elongated carrier 102, wherein the first and the second halves are not identical.

The second elongated reflective layer 107 has a width W2 measured from the first edge portion 103' of the elongated carrier 102.

Figure 1C:
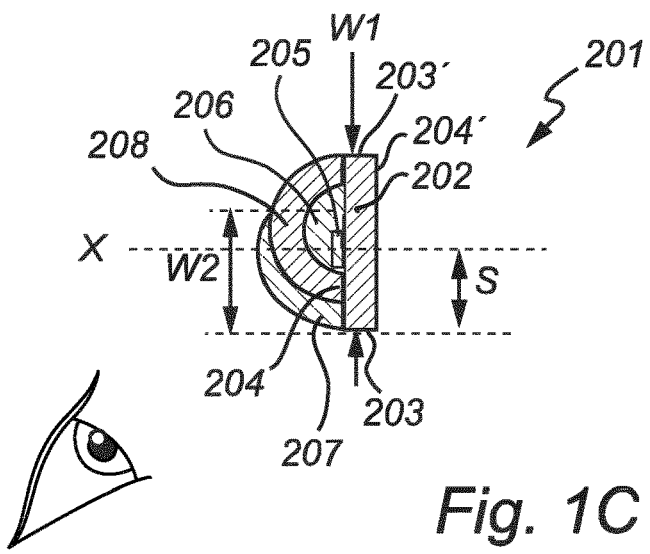

FIG. 1c depicts yet another embodiment of the LED filament according to the present invention. All the components are similar to the embodiment shown in FIG. 1b and will not be reiterated here for the sake of brevity. As may be seen in FIG. 1c, the width of the second elongated reflective layer 207 is greater than the distance from the first edge portion 203 to the plurality of first LEDs 205, i.e. W2>S.

As mentioned above, the elongated carrier, the first at least partially light-transmissive elongated layer and the second elongated reflective layer are preferably flexible, such that the LED filament may be arranged in a spiral or helix, thus resembling an incandescent light bulb.

Figure 3:
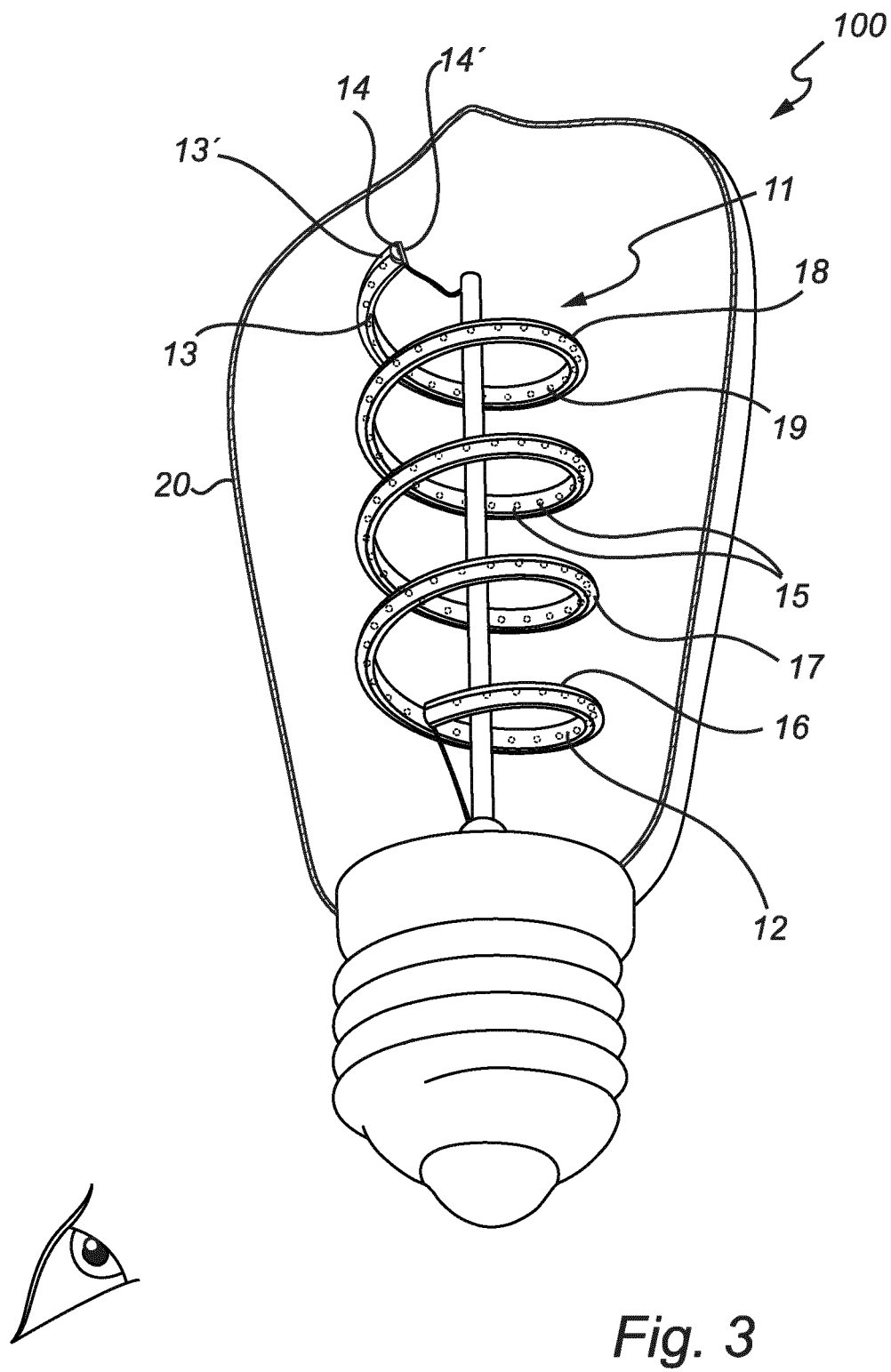
FIG. 3 shows a lamp according to the present invention.

Turning the attention to FIG. 2a, the LED filament 11 as shown in FIG. 3 is arranged in a spiral or helical shape such that a spiral 10 comprising the LED filament 11 is formed. The spiral 10 has a longitudinal extension along a central axis Y, an outer surface 18 facing away from the central axis Y, and an inner surface 19 facing the central axis Y. The first surface 14 of the LED filament constitutes the outer surface 18 of the spiral 10.

The spiral 10 comprising the LED filament 11 is arranged such that the central axis Y is oriented vertically. As may be seen in FIG. 2a, the elongated carrier 12 is arranged such that the first edge portion 13 of the elongated carrier 12 is oriented in a downward direction, and the second edge portion 13' of the elongated carrier 12 is facing in an upward direction. Thus, the second elongated reflective layer 17 is also oriented in the downward direction. Consequently, the directional LED light will be emitted substantially in the upward direction.

In the embodiment depicted in FIG. 2b, the second surface 114 of the elongated carrier 112 comprises a third at least partially light-transmissive elongated layer 118 partially encapsulating or covering the second surface 114' of the elongated carrier 112. As mentioned above, the third at least partially light-transmissive elongated layer 118 may have features being same as or different from the features of the first at least partially light-transmissive elongated layer 116.

The LED filament 111 depicted in FIG. 2b further comprises a fourth elongated reflective layer 119 asymmetrically encapsulating or covering a portion of the third at least partially light-transmissive elongated layer. The features of the fourth elongated reflective layer 119 may be same as or different from the features of the second elongated reflective layer 117. In particular, the fourth elongated reflective layer 119 has a width W4 measured from the first edge portion 113 of the elongated carrier 112 being greater than the width W2 of the second elongated reflective layer 117.

Finally, FIG. 3 illustrates a lamp 100 comprising a LED filament 11 disclosed above and a light exit window 20. In order to provide a lamp resembling an incandescent light bulb, the LED filament 11 is arranged in a spiral shape.

The lamp is arranged such that the outer surface 14 of the spiral comprising the LED filament 11 faces the light exit window 20. By such an arrangement, the LED filament light comprising or consisting of directional LED light will be emitted through the light exit window 20. The user observing the light exit window 20 will perceive an improved performance of the lamp, providing LED filament light of high quality spatial light distribution.

Although the present invention has been described with reference to various embodiments, those skilled in the art will recognize that changes may be made without departing from the scope of the invention. It is intended that the detailed description be regarded as illustrative and that the appended claims including all the equivalents are intended to define the scope of the invention. While the present invention has been illustrated in the appended drawings and the foregoing description, such illustration is to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light-emitting diode (LED) filament configured to provide LED filament light and comprising:
    an elongated carrier comprising a first elongated edge portion and a second elongated edge portion arranged at a distance (W1) from said first elongated edge portion, a first surface, a second surface arranged opposite to said first surface, said first and said second surfaces being delimited by said first and said second edge portions;
    a plurality of first light-emitting diodes, LEDs, distributed along said first surface of said elongated carrier, the plurality of first LEDs being configured to emit a first LED light;
    a first at least partially light-transmissive elongated layer encapsulating or covering said plurality of first LEDs and at least partially encapsulating or covering said first surface of said elongated carrier;
    a second elongated reflective layer arranged to asymmetrically encapsulate or cover a portion of said first at least partially light-transmissive elongated layer,
    wherein said plurality of first LEDs is arranged at a distance S from said first elongated edge portion of said elongated carrier,
    wherein said plurality of first LEDs is arranged asymmetrically on said first surface of said elongated carrier, such that S≠W1/2,
    wherein said second elongated reflective layer has a width (W2) measured from said first edge portion of said elongated carrier, wherein the ratio W2/W1 is from 0.3 to 0.8, and
    wherein said first at least partially light-transmissive elongated layer is at least partially translucent, and said second elongated reflective layer is free from a light-converting material.

2. The LED filament according to claim 1, wherein said second elongated reflective layer has reflectivity of at least 70%.

3. The LED filament according to claim 2, wherein said second elongated reflective layer has transmittance in the range from 10% to 30%.

4. The LED filament according to claim 1, wherein said plurality of first LEDs is arranged at the distance S from said first elongated edge portion of said elongated carrier, and wherein W2>S.

5. The LED filament according to claim 1, wherein said elongated carrier, said first at least partially light-transmissive elongated layer and said second elongated reflective layer are flexible.

6. The LED filament according to claim 5, wherein said LED filament is arranged in a spiral or helix.

7. The LED filament according to claim 1, wherein said second surface of said elongated carrier comprises a third at least partially light-transmissive elongated layer at least partially encapsulating or covering said second surface of said elongated carrier, and a fourth elongated reflective layer asymmetrically encapsulating or covering a portion of said third elongated reflective layer.

8. The LED filament according to claim 7, wherein said LED filament comprises a plurality of second light-emitting diodes, LEDs, distributed along said second surface of said elongated carrier, the plurality of second LEDs being configured to emit a second LED light, wherein said third at least partially light-transmissive elongated layer is arranged for encapsulating or covering said plurality of second LEDs.

9. The LED filament according to claim 1, wherein said first at least partially light-transmissive elongated layer is transparent.

10. The LED filament according to claim 1, wherein said elongated carrier is at least partially light-transmissive.

11. The LED filament according to claim 1, wherein said first at least partially light-transmissive elongated layer comprises a luminescent material configured to at least partially convert said LED light into converted light.

12. A lamp or a luminaire comprising a LED filament according to claim 1 and a light exit window.

13. A lamp or a luminaire according to claim 12 comprising a LED filament, further comprising a controller for individually controlling said plurality of first LEDs and said plurality of second LEDs for providing different directional LED lights.

14. A light-emitting diode (LED) filament configured to provide LED filament light and comprising:
- an elongated carrier comprising a first elongated edge portion and a second elongated edge portion arranged at a distance (W1) from said first elongated edge portion, a first surface, a second surface arranged opposite to said first surface, said first and said second surfaces being delimited by said first and said second edge portions;
- a plurality of first light-emitting diodes, LEDs, distributed along said first surface of said elongated carrier, the plurality of first LEDs being configured to emit a first LED light;
- a first at least partially light-transmissive elongated layer encapsulating or covering said plurality of first LEDs and at least partially encapsulating or covering said first surface of said elongated carrier;
- a second elongated reflective layer arranged to asymmetrically encapsulate or cover a portion of said first at least partially light-transmissive elongated layer,
- wherein said plurality of first LEDs is arranged at a distance S from said first elongated edge portion of said elongated carrier,
- wherein said plurality of first LEDs is arranged asymmetrically on said first surface of said elongated carrier, such that $S \neq W1/2$,
- wherein said second elongated reflective layer has a width (W2) measured from said first edge portion of said elongated carrier, wherein the ratio W2/W1 is from 0.3 to 0.8, and
- wherein said second surface of said elongated carrier comprises a third at least partially light-transmissive elongated layer at least partially encapsulating or covering said second surface of said elongated carrier, and a fourth elongated reflective layer asymmetrically encapsulating or covering a portion of said third elongated reflective layer.

15. The LED filament according to claim 14, wherein said LED filament comprises a plurality of second light-emitting diodes, LEDs, distributed along said second surface of said elongated carrier, the plurality of second LEDs being configured to emit a second LED light, wherein said third at least partially light-transmissive elongated layer is arranged for encapsulating or covering said plurality of second LEDs.

* * * * *